United States Patent [19]

Stein

[11] Patent Number: 5,142,342
[45] Date of Patent: Aug. 25, 1992

[54] OPTOCOUPLER

[75] Inventor: Karl-Ulrich Stein, Unterhaching, Fed. Rep. of Germany

[73] Assignee: Siemens Aktiengesellschaft, Munich, Fed. Rep. of Germany

[21] Appl. No.: 568,018

[22] Filed: Aug. 16, 1990

[30] Foreign Application Priority Data

Sep. 7, 1989 [DE] Fed. Rep. of Germany ....... 3929795

[51] Int. Cl.$^5$ ............................................. H01L 33/00
[52] U.S. Cl. ......................................... 357/17; 357/19; 357/30
[58] Field of Search ............................. 357/17, 30, 19

[56] References Cited

U.S. PATENT DOCUMENTS

| | | | |
|---|---|---|---|
| 3,304,431 | 2/1967 | Biard et al. | 357/19 |
| 3,321,631 | 5/1967 | Biard et al. | 357/19 |
| 3,436,548 | 4/1969 | Biard et al. | 357/19 |
| 3,946,423 | 3/1976 | Augustine | 357/19 |
| 4,390,790 | 6/1983 | Rodriguez | 250/551 |
| 4,755,697 | 7/1988 | Kinzer | 357/19 |
| 4,888,625 | 12/1989 | Mueller | 357/19 |

FOREIGN PATENT DOCUMENTS

3402629 7/1984 Fed. Rep. of Germany.
3708812 10/1987 Fed. Rep. of Germany.

OTHER PUBLICATIONS

Sarro et al., "Silicon Canitlever Beams . . . Sensor Applications,", J. Electrochem. Sec.: Solid-State Science and Technology, 1986, pp. 1724-1729.
Ohura et al., "A Dielectrically Isolated . . . Direct Bonding,", IEEE Electron Device Letters, vol. EDL-8, No. 10, 1987, pp. 454-456.

*Primary Examiner*—Andrew J. James
*Assistant Examiner*—T. Davenport
*Attorney, Agent, or Firm*—Hill, Van Santen, Steadman & Simpson

[57] ABSTRACT

An optical coupler has a light-emitting semiconductor component and a light-receiving semiconductor component that are connected to one another via an electrically-insulating, light-transmissive coupling and provide a voltage output, particularly for the drive of field-effect transistors. The light-receiving semiconductor component is a semiconductor chip in which a plurality of photoelements are integrated connected in series.

7 Claims, 1 Drawing Sheet

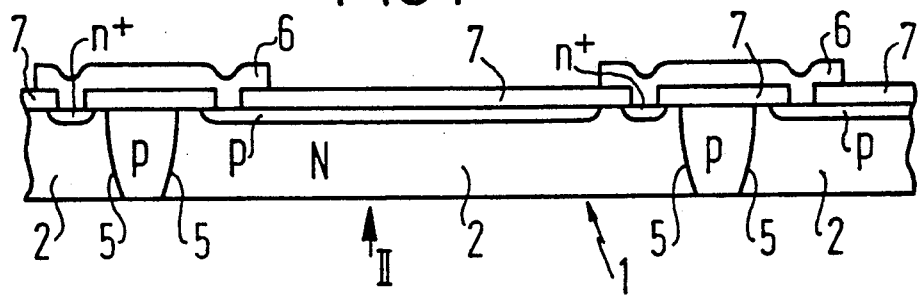
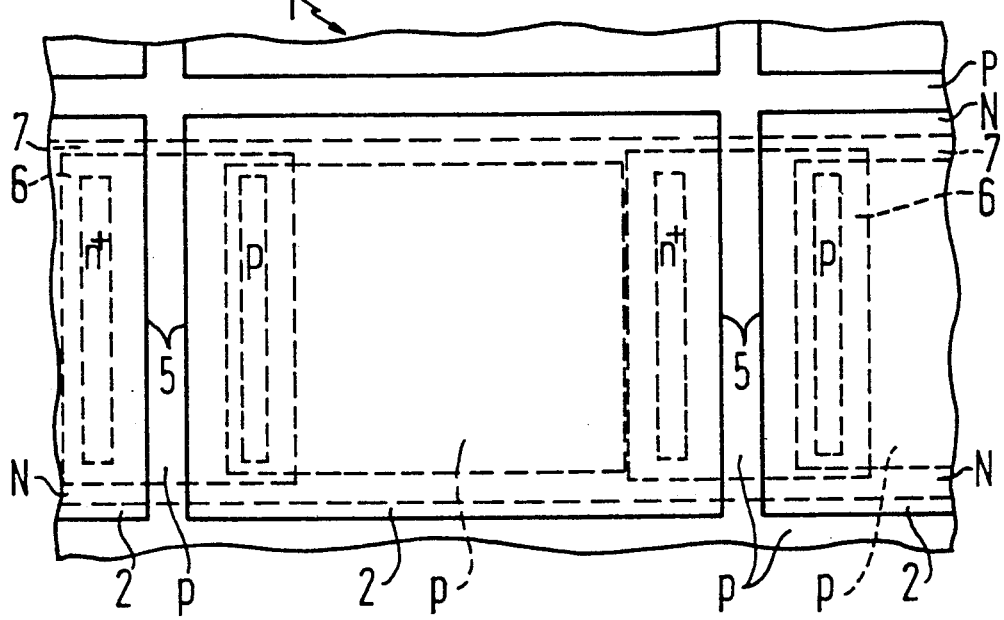
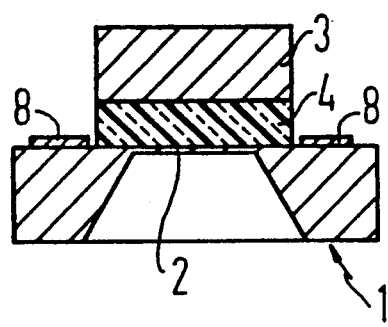
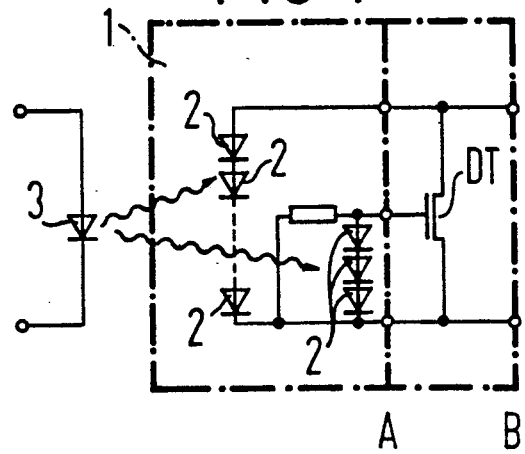

OPTOCOUPLER

BACKGROUND OF THE INVENTION

1. Field of the Invention

The present invention relates to an optocoupler having a light-emitting semiconductor component and having a light-receiving semiconductor component that are connected to one another via an electrically-insulating, light-transmissive coupling agent.

2. Description of the Prior Art

Optocouplers of the type set forth above are generally known in the art. They serve the purpose of reaction-free signal transmission between two voltaically-separated circuits, namely a primary circuit and a secondary circuit. At the primary side, they are composed of a light-emitting semiconductor component, for example a light-emitting semiconductor diode (LED), and, at the secondary side, they are composed of a light-receiving semiconductor component, for example a photodiode or a phototransistor. These components are optically coupled to one another. For example, a transparent plastic is used as a coupling agent.

The optocouplers that are currently in most widespread use have a bipolar transistor at their secondary sides. The output of the coupler therefore represents a variable resistor having a transistor characteristic.

An optocoupler that outputs a voltage on the order of magnitude of 5 volts at the secondary side is required for the drive of field-effect transistors, particularly metal-oxide-semiconductor (MOS) transistors, in particular without an additional voltage source. Such a coupler is particularly multiply required for a test access per telephone subscriber line in a computer-controlled telephone switching system.

Optocouplers of this type having a voltage output require the series connection of a plurality of photoelements, i.e. active two-terminal networks having a pn junction that have a relatively low internal resistance. They can be discretely constructed or can be constructed with a hybrid technique that combines a plurality of chips. When one wishes to monolithically integrate the photoelements, then the individual photoelements must be separated from one another by dielectric insulation. Photoelements in amorphous or crystalline semiconductor layers on insulators, for example, amorphous silicon or silicon dioxide layers are likewise useable. Due to the complex structure, however, all of these possibilities are complicated and involve a time expense or, respectively, cost expense in manufacture.

SUMMARY OF THE INVENTION

The object of the present invention, therefore, is to provide an optocoupler which has a voltage output that can be realized in a simple cost-effective manner, that can be integrated with further components and that, above all, is suitable for driving field-effect transistors without an additional voltage source and, therefore, can be particularly employed for a test access in modern telephone switching systems.

In an optocoupler of the type initially set forth, this object is achieved, according to the present invention, in that the light-receiving semiconductor component is a semiconductor chip in which a plurality of photodiodes, connected in series, are integrated.

The semiconductor chip is thereby preferably composed of a partially thinly etched silicon substrate wafer in which the individual photoelements are realized in the thin-etched part by parting or separating diffusion. The pn junctions formed by the parting diffusion are thereby advantageously protected against light incidence by a contact metalization. The layer thickness of the semiconductor chip, preferably a silicon chip, advantageously amounts to approximately 15 $\mu$m in the region of the photoelements.

The advantages obtained with the present invention particularly reside in that the semiconductor component of the optocoupler serving as a receiver is integrated as a series circuit of photoelements in a semiconductor chip that is preferably composed of silicon. In the region of the photoelements, the silicon wafer is thereby etched off down to a thin, expediently about 15 $\mu$m thick silicon layer, being etched off in a method like that also employed for pressure sensors. The individual photoelements are produced in the silicon layer by parting diffusions. The pn junctions of the parting diffusions, for example, are completely protected against light incidence by the metalization that is already otherwise required. The special advantage of this arrangement is that the partially thin-etched silicon substrate that is tested, detached and bonded like a standard chip is significantly less expensive than any solution having a substrate with a dielectric insulation. A further advantage resides in the fact that, in addition to chains of photoelements, lateral components such as resistors or metal-oxide-semiconductor (MOS) transistors and, in the framework of the epitaxy required for the thin-film manufacture, vertical switch elements such as power MOS transistors as well can be manufactured in this technology.

One or more series of circuits of photoelements, together with further switch elements as needed, are monolithically united in a receiver chip for an optocoupler having one or more voltage outputs. It can therefore contain an inherently-known circuit for a drive optocoupler. This receiver chip is packed together with a light emitting diode as a light transmitter in an optocoupler in a conventional manner.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a sectional view of a photoelement series circuit in the thin region of a silicon receiver chip;

FIG. 2 is a plan view onto the photoelement series circuit of FIG. 1;

FIG. 3 is a sectional view through an optocoupler; and

FIG. 4 is a schematic circuit diagram of a drive optocoupler for a telephone subscriber test access.

DESCRIPTION OF THE PREFERRED EMBODIMENTS

A light-receiving semiconductor component 1 is illustrated in FIGS. 1 and 2 and forms a part of the optocoupler of the present invention which has a voltage output. This receiver in the present example is a silicon chip 1. The illustrated, thin region is a part of an n-doped silicon substrate wafer 1 that is etched off down to an n-conductive silicon layer that is only approximately 15 $\mu$m thick, the etching occurring in a method as is employed for pressure sensors. Regions, in the form of p-conductive regions, for forming the photoelements 2 are driven into the n-doped silicon substrate. The n-doped silicon substrate with its p-conductive islands is divided by parting diffusions, p diffusions in this case, such that the p junction or, respectively, partition walls 5 are formed and laterally limit a plurality of photoelements 2. The surface of the n-silicon substrate wafer 1 is covered with a silicon oxide layer 7 that serves as a surface passivation layer. For contacting the photoelements 2, the passivation layer 7 comprises recesses at appropriate locations, so that a metalization or, respectively, contact layer 6 advantageously composed of aluminum can be directly brought into contact with the respective p regions and can be brought into contact with the n regions via a respective n+ contact diffusion region such that the desired series circuit is formed. The contact metalizations 6 thereby also satisfy a further purpose in that they are applied on the receiver chip 1 such that they completely protect the pn junctions or, respectively, partition walls 5 that were produced in the chip 1 by the parting diffusion against disturbing light incidence without covering those areas of the photoelements 2 that are to be illuminated by the light that occurs from the light-emitting semiconductor component.

The optocoupler shown in a purely schematic manner in FIG. 3 particularly illustrates the cross section of the receiver chip 1 with the photoelement series circuit. The receiver chip 1 is optically coupled to the transmitter chip 3, for example a light-emitting diode, via a suitable coupling agent 4, for example a light-transparent, elastic, insulating synthetic resin. The photoelements 2 are integrated in the thin web part of the receiver chip 1 connected in series. The two contacts 8 represent the voltage output of the optocoupler and are parts of the contact metalization that is employed for series connection of the photoelements 2. In addition to the photoelements, further integrated switch components are produced, preferably in the region of the thicker portions of the semiconductor chip 1, being preferably manufactured upon employment of the same process steps as for the photoelements 2. These switch elements are preferably MOS transistors for the utilizations of the optocoupler in communications technology. They can be fashioned as lateral or vertical transistors of the enhancement type or of the depletion type.

A circuit that can be monolithically integrated, for example, next to the photoelements 2 in the receiver chip is shown in FIG. 4. This circuit of a drive optocoupler for a telephone subscriber test access comprises two possible interfaces (A and B) that are indicated by dot-dash lines. The interface A is the interface for an external pull-down depletion transistor DT, and the interface B is an interface for an integrated depletion transistor DT. The wave-like arrows indicate the optical radiation emitted by the transmitter chip light emitting diode 3 in the direction toward the photoelements 2 of the receiver chip.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An optocoupler comprising:
    a light-emitting semiconductor component;
    an electrically-insulating light-transmissive coupling agent supporting said light-emitting semiconductor component;
    a light-receiving semiconductor component coupled to said light-emitting semiconductor component via said electrically-insulating light-transmissive coupling agent;
    a light-receiving component comprising a semiconductor chip including a plurality of photoelements integrated therein and connected in series; and
    said semiconductor chip comprising a silicon substrate wafer including a first portion having a first predetermined thickness and a thin-etched, second portion having a thinner second predetermined thickness and in which said plurality of photoelements are integrated and at least one parting diffusion in said thin-etched second portion separating said photoelements.

2. The optocoupler of claim 1, wherein:
    said at least one parting diffusion forms pn junctions; and a metal contact layer is carried on and is insulated from said at least one parting diffusion and shields said pn junctions against light incidence.

3. The optocoupler of claim 2, wherein:
    said thin-etched second portion of said silicon substrate wafer has a thickness of approximately 15 μm.

4. The optocoupler of claim 3, and further in combination with and connected to drive field-effect transistors.

5. The optocoupler of claim 4, and further comprising:
    semiconductor switch elements integrated in the same semiconductor chip.

6. The optocoupler of claim 5, wherein:
    said switch elements are field-effect transistors.

7. The optocoupler of claim 6, wherein:
    said plurality of photoelements comprise an output circuit; and
    a field-effect transistor is integrated in said semiconductor chip in said output circuit.

* * * * *